(12) United States Patent
Straussnig et al.

(10) Patent No.: US 7,262,723 B2
(45) Date of Patent: Aug. 28, 2007

(54) COMPENSATION CIRCUIT FOR CLOCK JITTER COMPENSATION

(75) Inventors: Dietmar Straussnig, Villach (AT); Bernd Rainer, Klagenfurt (AT); Andreas Wiesbauer, Portschach (AT); Richard Gaggl, Portschach (AT); Martin Clara, Villach (AT); Luis Hernandez, Madrid (ES)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/451,229

(22) Filed: Jun. 12, 2006

(65) Prior Publication Data
US 2006/0279441 A1    Dec. 14, 2006

(30) Foreign Application Priority Data
Jun. 10, 2005    (DE)    ........... 10 2005 026 899

(51) Int. Cl.
*H03M 1/10*    (2006.01)
(52) U.S. Cl. ................... 341/120; 341/144
(58) Field of Classification Search ............. 341/144, 341/143, 155, 120; 375/240.12, 376; 702/69
See application file for complete search history.

(56) References Cited

U.S. PATENT DOCUMENTS

| 5,241,384 | A  | * | 8/1993  | Maetani ................ 348/184 |
| 5,576,664 | A  | * | 11/1996 | Herold et al. ............ 331/1 A |
| 5,638,010 | A  |   | 6/1997  | Adams .................. 327/105 |
| 6,278,394 | B1 | * | 8/2001  | May ..................... 341/144 |
| 6,628,711 | B1 | * | 9/2003  | Mathew et al. ........ 375/240.12 |
| 6,640,193 | B2 | * | 10/2003 | Kuyel ................... 702/69 |
| 7,095,819 | B2 | * | 8/2006  | Bellaouar et al. ........ 375/376 |
| 7,177,430 | B2 | * | 2/2007  | Kim ..................... 380/252 |

OTHER PUBLICATIONS

German Office Action dated Mar. 13, 2006.

* cited by examiner

*Primary Examiner*—Peguy JeanPierre
(74) *Attorney, Agent, or Firm*—Jenkins, Wilson, Taylor & Hunt, P.A.

(57) ABSTRACT

A compensation circuit for a digital/analogue converter, which is clocked by a clock signal comprising a jitter and converts a digital input data signal into an analogue output data signal comprising a jitter error due to said jitter, comprises a measurement circuit for measuring the jitter and a modelling circuit for generating a digital modelled jitter error signal which simulates the jitter error dependent on the measured jitter and the digital input data signal, wherein the digital modelled jitter error signal is subtracted from the digital input data signal.

15 Claims, 9 Drawing Sheets

Output DIA on converter without jitter compensation;
SNR = 41.367 [dB]; jitter (nms) = 4.53262.e −011 [s]

Output DIA on converter with jitter compensation;
SNR = 60.5202 [dB]; jitter (nms) = 4.53262.e −011 [s]

COMPENSATION CIRCUIT FOR CLOCK JITTER COMPENSATION

BACKGROUND OF THE INVENTION

The invention relates to a compensation circuit for a digital/analogue converter.

FIG. 1 shows a conventional digital/analogue converter which is clocked by a clock signal CLK. The digital/analogue converter converts a digital data signal originating from a data source into an analogue output signal. The clock signal CLK is generated by a PLL circuit (phase-locked loop). The clock signal has a jitter in the time interval, i.e. the time interval of the clock pulse edges varies slightly from clock pulse period to clock pulse period. The clock jitter causes undesirable high-frequency signal distortions during the digital to analogue conversion. In the conventional circuit arrangement shown in FIG. 1, these distortions are suppressed by generating a clock signal having a very low jitter. For this purpose it is necessary to use clock signal sources such as the LC-PLL circuit shown in FIG. 1, which generates a low-jitter clock signal. The greater the resolution of the digital/analogue converter, the higher the requirements for its spectral purity, i.e. it is necessary to generate an especially spectrally pure clock signal. It requires significant technical outlay to distribute the low-jitter clock signal, which is usually generated centrally, within the entire system by means of multi-channel solutions without compromising the spectral purity of the clean clock signal generated at such expense.

Conventional systems which require a particularly high resolution during the digital to analogue conversion, such as ADSL transceivers or systems for example, or which require a wide signal bandwidth to be processed, such as VDSL systems for example, require highly accurate clock signals with very low jitter in the order of 5 ps to 15 ps RMS, which are generated by LC-PLL circuits for example. The required accuracy of the clock signal depends on the resolution of the digital/analogue converter and on other signal properties such as the crest factor and the maximum signal frequency to be processed for example. The maximum permitted jitter is calculated by means of a predetermined signal-to-noise ratio SNR in accordance with the following rule of thumb:

$$TJitter_{RMS} = \frac{10^{-SNR \cdot 20}}{2\pi f_{analogmax}}$$

A disadvantage of the conventional arrangement shown in FIG. 1 is that technically it is very costly to implement high-quality LC-PLL circuits that supply a low-jitter clock signal and they take up a lot of space when integrated on a chip. Moreover, high-quality LC-PLL circuits use a relatively large amount of power during operation, which creates undesired heat.

BRIEF SUMMARY OF THE INVENTION

A compensation circuit for a digital/analogue converter clocked by a clock signal, which converter converts a digital input data signal into an analogue output data signal, for compensating a jitter error of the analogue output signal produced by a jitter of the clock signal during the digital to analogue conversion, comprising:

a measurement circuit for measuring the jitter of the clock signal; and a modelling circuit for generating a digital modelled jitter error signal which simulates the jitter error produced during the digital to analogue conversion, depending on the measured jitter of the clock signal and the digital input data signal, wherein the generated modelled jitter error signal is subtracted from the digital input data signal.

In one embodiment of the inventive compensation circuit, a noise shaper for forming a quantization noise spectrum is connected upstream of the digital/analogue converter. The noise shaping may minimize the quantization error.

The modelled jitter error signal generated by the modelling circuit may be fed into a feedback loop of the noise shaper.

The noise shaper may have an input for receiving a digital data signal comprising a word width of n data bits, a separation circuit which separates the received data signal into m most significant data bits and into k least significant data bits, and an output for outputting the m most significant data bits as a digital input data signal to the digital/analogue converter.

The k least significant data bits may be fed back to the input of the noise shaper via a digital feedback filter.

The inventive compensation circuit may comprise, connected upstream of the digital feedback filter, a subtractor which subtracts the digital modelled jitter error signal generated by the modelling circuit from the least significant data bits.

The inventive compensation circuit may comprise an amplitude limiter connected upstream of the separation circuit of the noise shaper.

In one embodiment of the inventive compensation circuit, there is provided between the measurement circuit and the modelling circuit an analogue/digital converter which converts the measured jitter into a digital jitter value.

An averaging circuit which forms an average of the measured jitter may be connected upstream of the analogue/digital converter by means of a switch. The averaging circuit is preferably integrated in the jitter measurement circuit.

In a further embodiment of the inventive compensation circuit, the modelling circuit comprises:

a delay element for delaying an input data item of the digital input signal by one clock pulse period;

a subtractor which subtracts the delayed digital input data item from the digital input data item to generate a differential value;

a mixer which multiplies the jitter value output by the analogue/digital converter by the differential value in order to generate a product value; and a weighting circuit which applies a weighting to the generated product value in order to generate a jitter error value of the modelled jitter error signal.

The clock signal may be generated by a PLL circuit.

The PLL circuit may be a ring oscillator PLL circuit.

The weighting circuit may include a first multiplier for weighting the product value with the inverse clock pulse period of the clock signal and, connected in series with the first multiplier, a second multiplier for weighting with a selectable scaling factor.

An amplitude limiter may be connected downstream of the weighting circuit provided within the modelling circuit.

The measurement circuit for measuring the jitter may be formed by an analogue switched capacitor measurement circuit.

BRIEF DESCRIPTION OF THE SEVERAL VIEWS OF THE DRAWINGS

Preferred embodiments of the compensation circuit according to the invention will be described below with reference to the attached figures for explaining the key features of the invention.

DETAILED DESCRIPTION OF THE INVENTION

Figure 1:
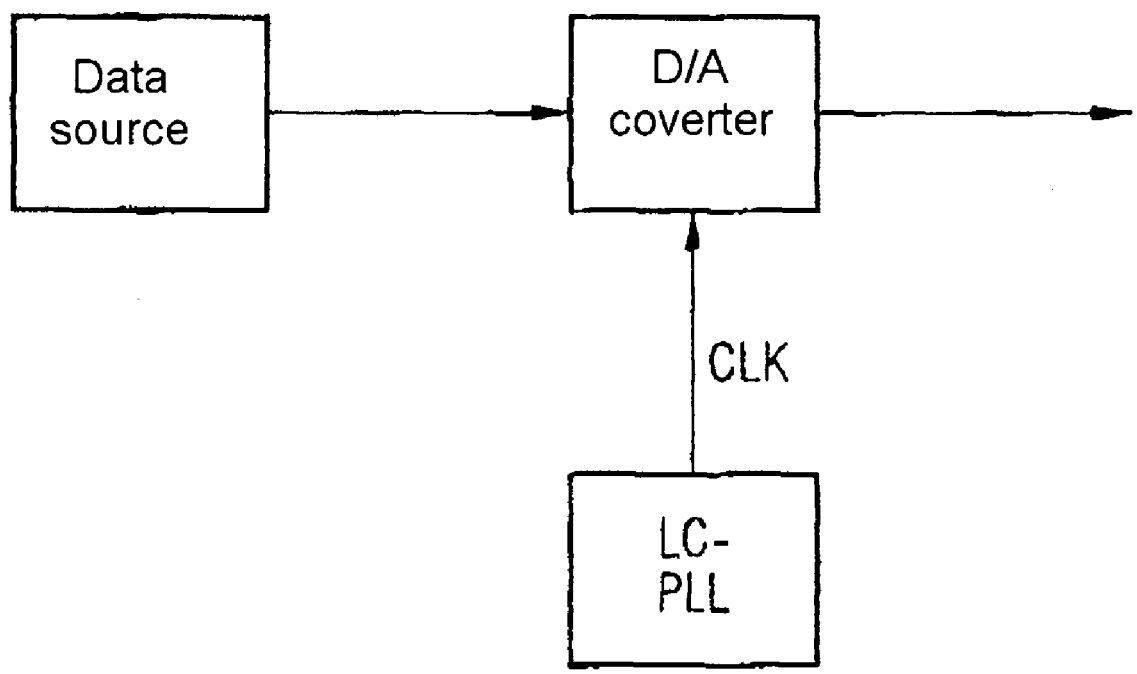
FIG. 1, as discussed above, is a conventional circuit arrangement.
Figure 2:
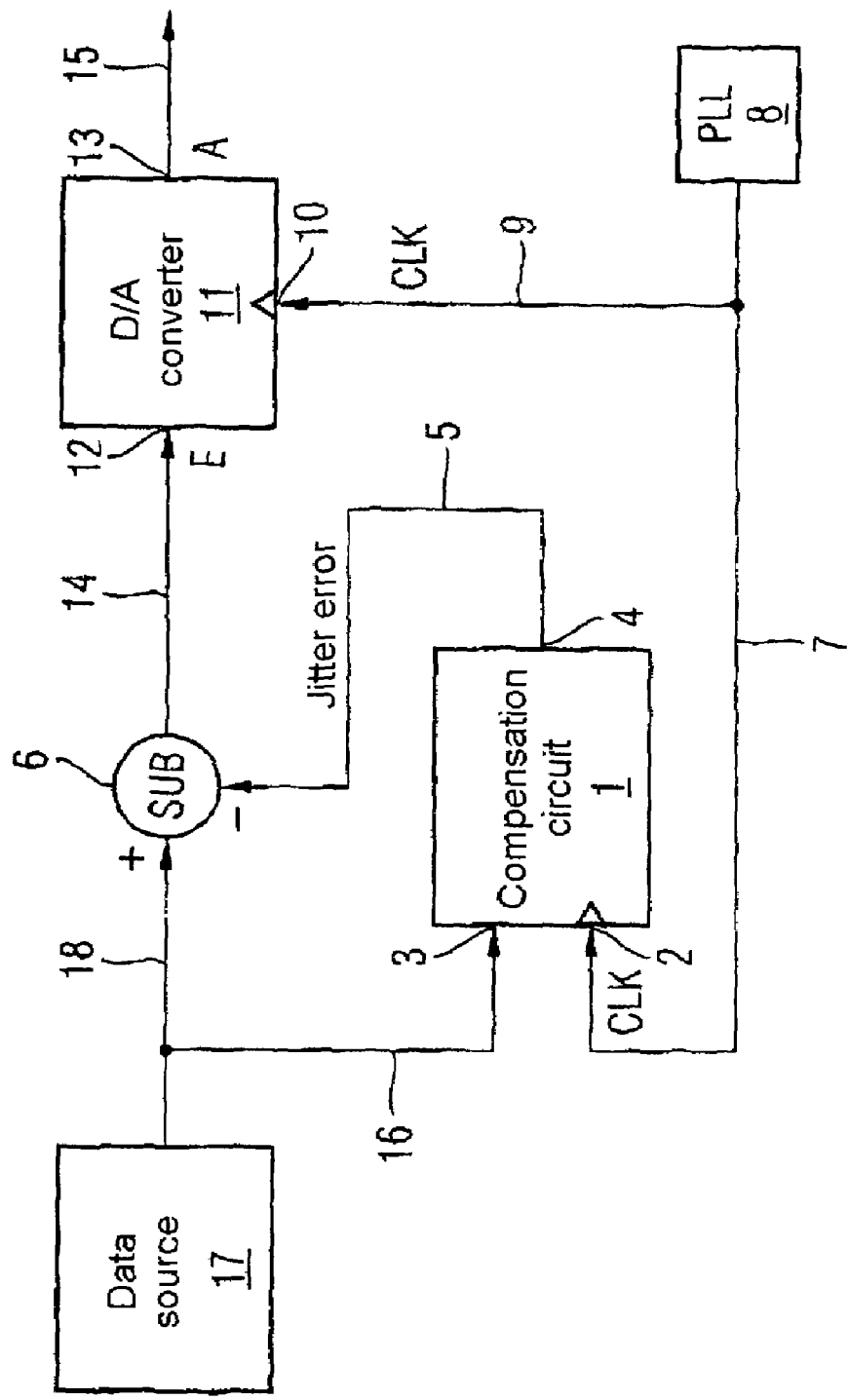
FIG. 2 is an exemplary embodiment of a digital/analogue converter with an inventive compensation circuit.

As can be seen from FIG. 2, the circuit arrangement shown there provides a compensation circuit 1 according to the invention which has a clock signal input 2 and data signal input 3. Via a line 5, the compensation circuit 1 outputs a jitter error signal at an output 4 to a subtractor 6. The generated jitter error signal of the compensation circuit 1 serves to compensate a jitter error of the analogue output signal produced by a jitter of the clock signal CLK during a digital to analogue conversion. At its input 2, the compensation circuit 1 receives the clock signal CLK with a clock jitter via a clock signal line 7. The clock signal CLK is generated by a clock generator, in particular a PLL circuit 8. The generated clock signal CLK is applied via a further clock signal line 9 to a clock signal input 10 of a digital/analogue converter 11. The digital/analogue converter 11 has a digital signal input 12 and an analogue signal output 13. The output of the subtractor 6 is connected via a line 14 to the digital input 12 of the digital/analogue converter 11. The digital/analogue converter 11 converts the digital input data signal E present at the digital input 12 into an analogue output data signal A and outputs the converted analogue output data signal A via a line 15 for further signal processing. The data input 3 of the compensation circuit 1 receives a digital input data signal via a data line 16 from any given data source 17. The digital input data signal is furthermore supplied via data lines 18 to the subtractor 6 which subtracts the modelled jitter error signal output by the compensation circuit 1 from the digital input data signal, with the modelled digital jitter error signal modelling the jitter error exhibited by the analogue output signal A at the output 13 of the digital/analogue converter 11, which error was produced by the digital/analogue converter 11 during the digital to analogue conversion.

The basic idea of the compensation circuit 1 according to the invention is to compensate by means of a modelling circuit contained in the compensation circuit 1 the jitter error produced by the digital/analogue converter 11 during the digital to analogue conversion as a result of the clock jitter or, respectively, the signal distortion of the analogue output signal A produced by the clock jitter, by simulating the jitter error produced.

Figure 3:
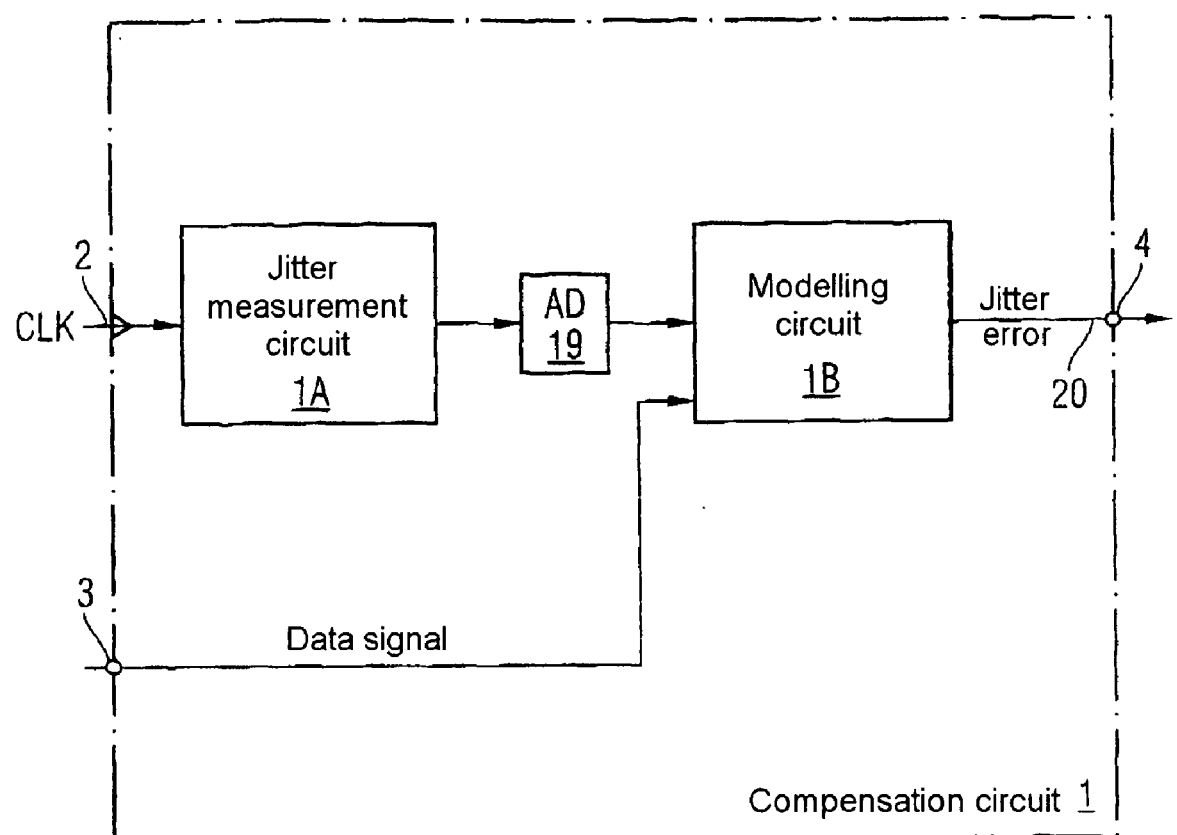
FIG. 3 is a block diagram of an inventive compensation circuit.

FIG. 3 shows a preferred embodiment of the compensation circuit 1 according to the invention. The compensation circuit 1 comprises two sub-circuits, namely a jitter measurement circuit 1A and a downstream modelling circuit 1B. The jitter measurement circuit 1A serves to measure the clock jitter of the applied clock signal CLK. In the case of one embodiment of the compensation circuit 1 according to the invention, the measured jitter is output directly via an analogue/digital converter 19 to the modelling circuit 1B. Depending on the measured jitter value of the clock signal CLK and on the digital input data signal value present at the input 3, said modelling circuit generates a digital modelled jitter error signal value which simulates the jitter error of the analogue output data signal A produced by the digital/analogue converter 11. The generated jitter error is output via an internal line 20 to the output 4 of the compensation circuit 1.

Figure 4:
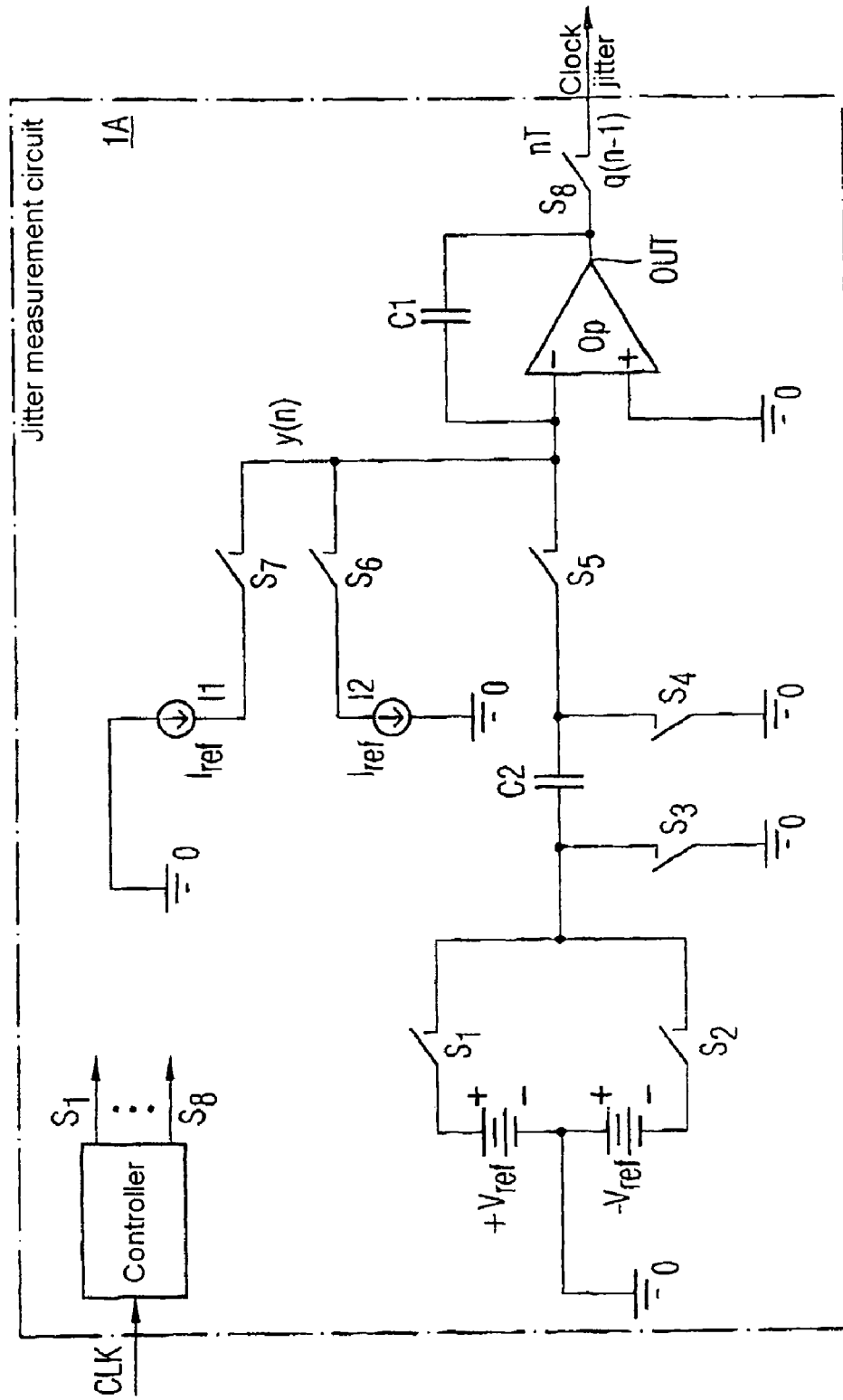
FIG. 4 is a circuit diagram of an exemplary embodiment of a jitter measurement circuit within the inventive compensation circuit.

FIG. 4 shows an embodiment of the jitter measurement circuit 1A. In the case of the embodiment illustrated, the jitter measurement circuit 1A comprises a measurement circuit designed using analogue switched capacitor technology. An internal controller receives the clock signal CLK and controls internal switches S1-S8. The jitter measurement circuit 1A contains a first capacitor C1 and a second capacitor C2. The charge $Q_{C2}$ temporarily stored in the capacitor C2 is proportional to the clock pulse period of the ideal clock signal $T_{CLK\text{-}ideal}$. The charge $Q_{C1}$ temporarily stored in the capacitor C1 is proportional to the clock pulse period of the clock signal $T_{CLK\text{-}real}$ currently applied. The operational amplifier OP provided in the jitter measurement circuit 1A generates a voltage proportional to the difference between the temporarily stored charges $Q_{C1}$, $Q_{C2}$. The output voltage of the jitter measurement circuit 1A is consequently proportional to the difference between the clock pulse period of the real clock signal $T_{CLK\text{-}real}$ and the clock pulse period of the ideal clock signal $T_{CLK\text{-}ideal}$, i.e. the amplitude of the signal output by the jitter measurement circuit 1A is proportional to the jitter of the clock signal CLK.

Figure 5:
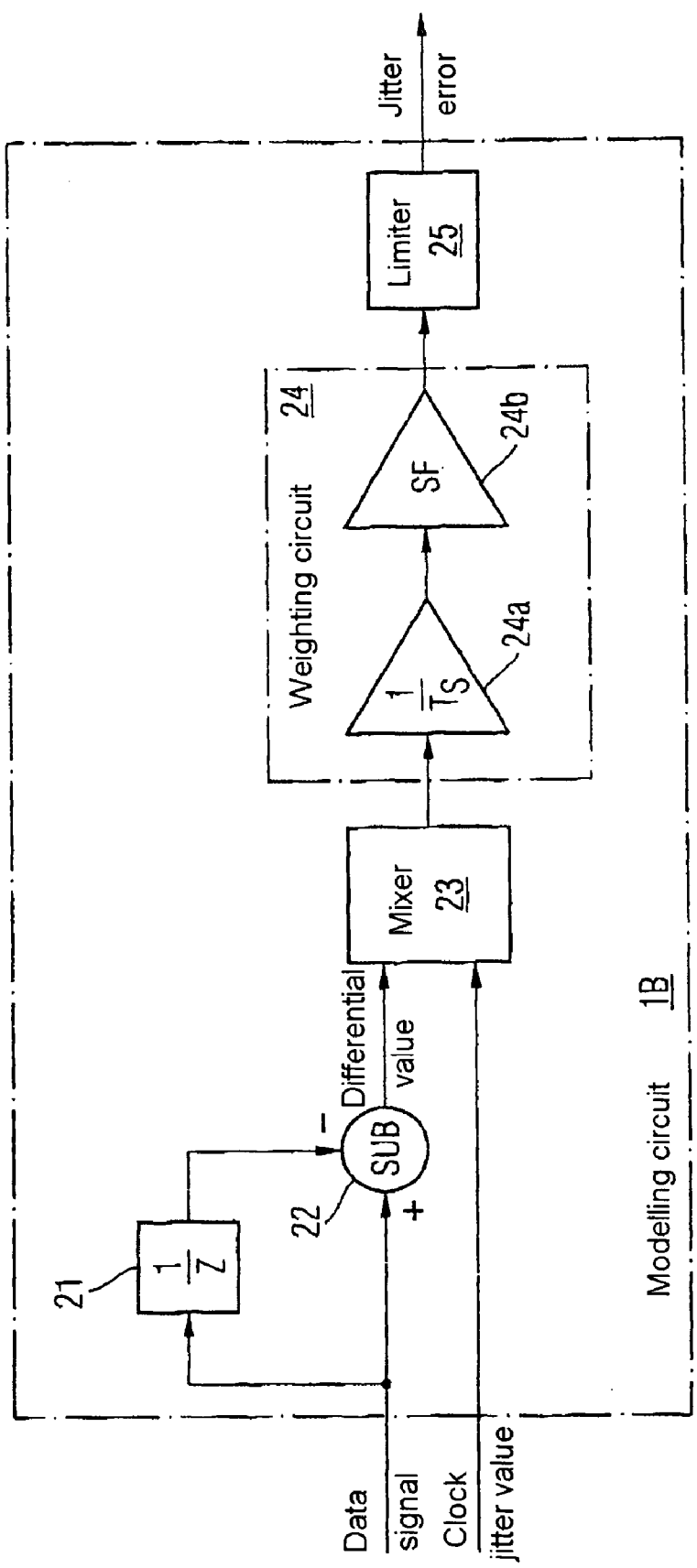
FIG. 5 is an exemplary embodiment of the modelling circuit contained within the inventive compensation circuit.

FIG. 5 shows a preferred embodiment of the modelling circuit 1B according to the invention within the compensation circuit 1 according to the invention as illustrated in FIG. 3. The modelling circuit 1B receives the data signal present at the compensation circuit 1 via an internal data signal line. In addition, the modelling circuit 1B receives the digital clock jitter signal converted by the analogue/digital converter 19 from the jitter measurement circuit 1A. The modelling circuit 1B preferably has a delay element 21 which delays the input data item of the data signal present by one clock pulse period. In addition, the modelling circuit 1B contains an internal subtractor 22 which subtracts the delayed digital input data item from the digital input data item in order to generate a differential value. A mixer 23 provided within the modelling circuit 1B multiplies the clock jitter value output by the analogue/digital converter 19 by the differential value output by the subtractor 22 in order to generate a product value. The analogue/digital converter 19 is provided between the jitter measurement circuit 1A and the modelling circuit 1B and converts the analogue clock jitter signal generated by the jitter measurement circuit 1A into a digital clock jitter value which is supplied to the modelling circuit 1B. A weighting circuit 24 is connected downstream of the mixer 23. The weighting circuit 24 applies a weighting to the product value generated by the mixer 23 in order to generate a jitter error value of the modelled jitter error signal. The weighting circuit 24 here preferably has a first multiplier 24a and a second multiplier 24b connected in series with the first. The first multiplier 24a weights the product value with the inverse clock pulse period of the clock signal CLK. The second multiplier 24b connected in series therewith weights the signal preferably with a selectable scaling factor SF. In a preferred embodiment, an amplitude limiter 25 is connected downstream of the weighting circuit 24.

In an alternative embodiment of the compensation circuit 1 according to the invention, an averaging circuit is additionally provided between the jitter measurement circuit 1A and the modelling circuit 1B, which averaging circuit can be connected by means of a controllable switch between the two units 1A, 1B. The averaging circuit forms an average of the measured jitter, that is to say a predetermined number of samples of a sampled clock jitter signal are averaged and the averaged jitter is supplied to the analogue/digital converter 19. The higher the number of jitter samples, the lower the sampling rate, and consequently the lower the clock frequency of the clock signal used to clock the analogue/digital converter 19, so that the power loss of the analogue/digital converter 19 is reduced. However, as the number of samples during averaging increases, the worse the compensation of the jitter error in the analogue output signal A of the digital/analogue converter 11 becomes. The averaging circuit is preferably integrated in the jitter measurement circuit 1A.

Figure 6:
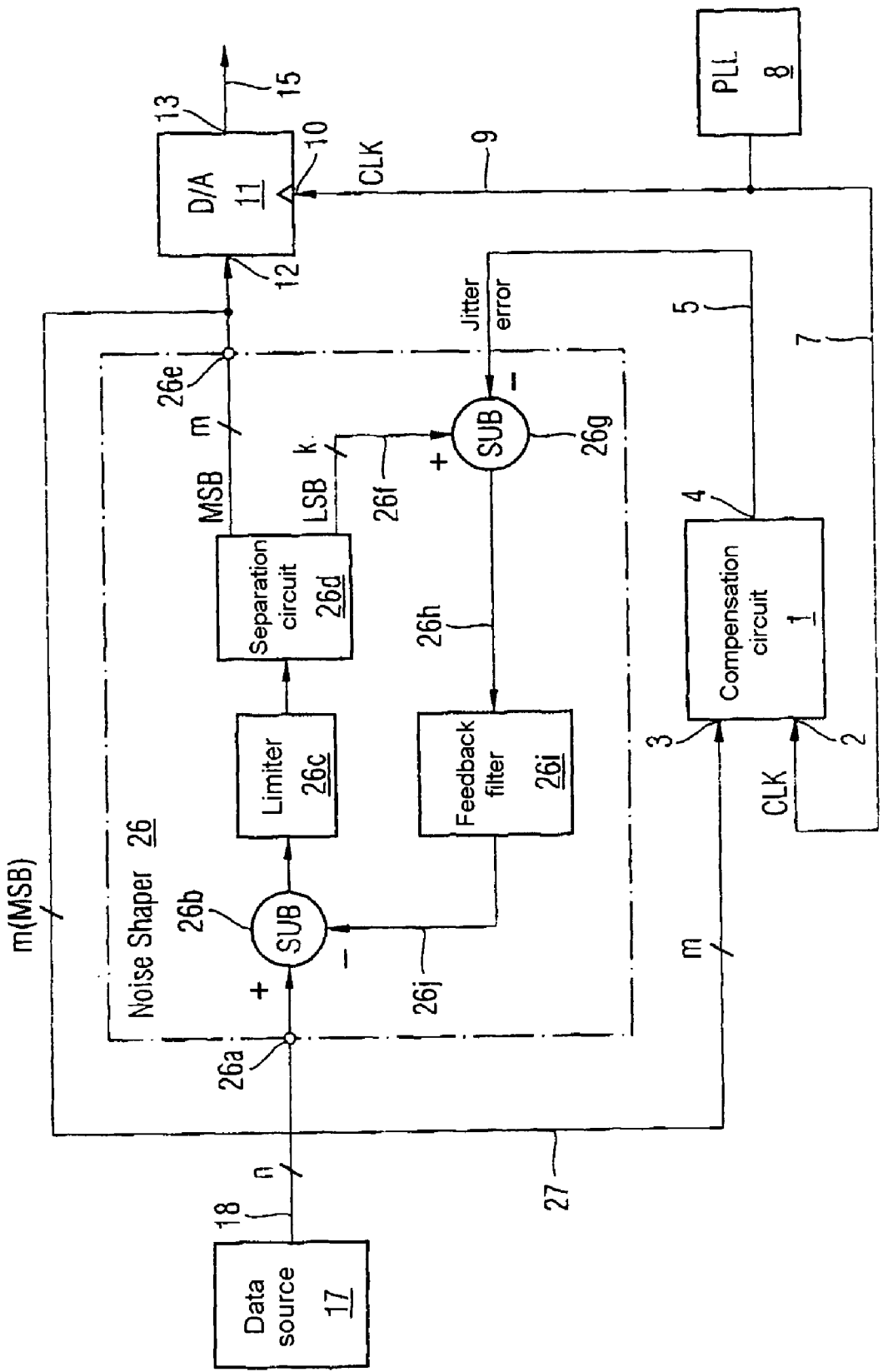
FIG. 6 is an exemplary embodiment of an inventive circuit arrangement, in which a noise shaper is connected upstream of the digital/analogue converter.

FIG. 6 shows a circuit arrangement in which a noise shaper 26 is connected upstream of the digital/analogue converter 11. In the circuit arrangement illustrated in FIG. 6, the modelled jitter error signal generated by the compensation circuit 1 is fed into a feedback loop of the noise shaper 26 in order to simulate the jitter error signal produced by the digital/analogue converter 11 at the output 13. The noise shaper 26 has a signal input 26a for receiving the digital data input signal. The digital input signal originates from any given data source. The data line 18 preferably has n data lines, that is to say the input data item comprises n data bits. The input data item is supplied to a subtractor 26b provided in the noise shaper 26. The output of the subtractor 26b is preferably connected to an amplitude limiter 26c. Connected downstream of the amplitude limiter 26c on the output side is a data bit separation circuit 26d which separates the data signal into m most significant data bits (MSB) and into k least significant data bits (LSB). The m most significant data bits (MSB) are applied at an output 26e of the noise shaper 26 as a digital input data signal at the input 12 of the digital/analogue converter 11. The k least significant data bits (LSB) separated by the separation circuit 26d are supplied to a subtractor 26g via an internal line 26f, which subtractor subtracts the digital modelled jitter error signal generated by the compensation circuit 1 according to the invention from the least significant data bits (LSB). The digital differential value generated by the subtractor 26g is digitally filtered by a digital feedback filter 26i via a line 26h, and is supplied via a line 26j to the subtractor 26g within the noise shaper 26.

The m most significant data bits (MSB) output by the noise shaper 26 are supplied via a line 27 to the data input 3 of the compensation circuit 1 according to the invention.

The noise shaper 26 is a circuit for forming the quantization noise or the quantization error in a fundamental frequency band. The modelled jitter error generated by the compensation circuit 1 according to the invention is fed into the feedback loop of the noise shaper 26.

Figure 7:
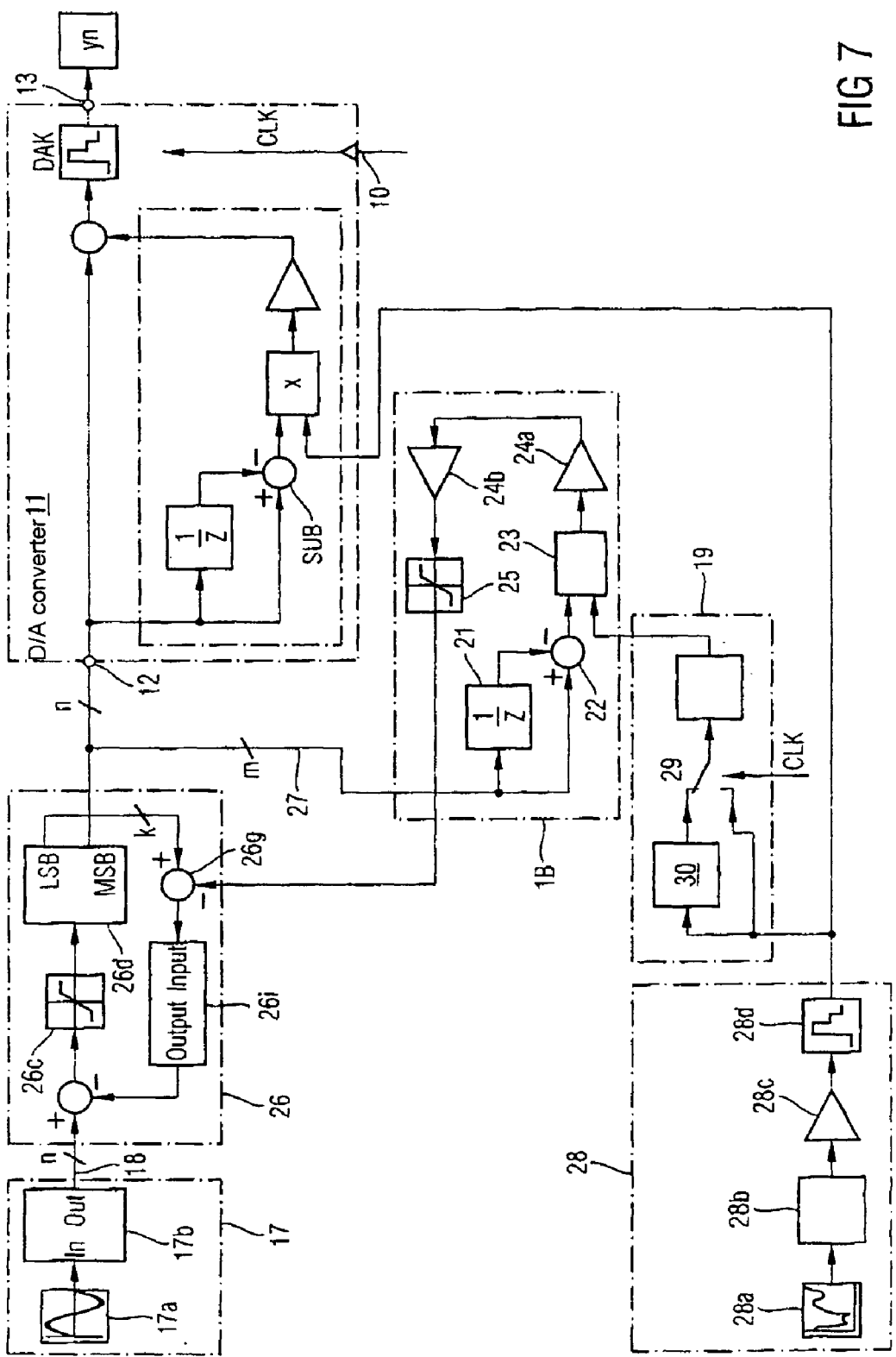
FIG. 7 is a test arrangement for testing the inventive compensation circuit.

FIG. 7 shows a test arrangement for testing or simulating the compensation circuit 1 according to the invention.

In the test arrangement, a noise shaper 26 which generates a digital data signal comprising n bits from a data source 17 is connected upstream of the digital/analogue converter 11. In the test arrangement, the data source 17 is formed by a sinusoidal signal generator 17a and a downstream analogue/digital converter 17b. The noise shaper 26 thus receives a digital sinusoidal data signal over the n-bit data line 18. The reference circuit 26d within the noise shaper 26 separates the data signal into k least significant data bits (LSB) and into m most significant data bits (MSB). The most significant data bits are supplied to the digital data input 12 of the digital/analogue converter 11 and are furthermore applied to the modelling circuit 1B. The simulated digital/analogue converter 11 illustrated in FIG. 7 contains an ideal digital-to-analogue converter (DAU). The jitter error produced by the digital/analogue converter is simulated by means of a circuit comprising a delay element, a subtractor, a mixer and an amplifier. During the simulation, said circuit forms a model for the jitter error of the output signal of the digital/analogue converter 11. Said circuit is provided in the modelling circuit 1B in the form of the delay element 21, the subtractor 22, the mixer 23 and the multiplier 24a. The modelling circuit 1B also contains a further multiplier 24b for scaling and an amplitude limiter 25. In order to measure the jitter error, a clock signal jitter is generated or simulated by generator circuit 28. The generator circuit 28 contains a noise source 28a for generating a white noise signal. Connected downstream of the noise source is an analogue bandpass filter 28b and a weighting circuit 28c. A sampling circuit 28d within the generator circuit 28 performs sampling. The clock jitter signal generated in this way is either supplied directly to the digital/analogue converter 19 via a switch 29, or is first applied to a circuit 30 in order to form an average. The switch 29 is controlled by means of a control signal RTL, so that it is possible to switch between two testing modes.

Figure 8A:
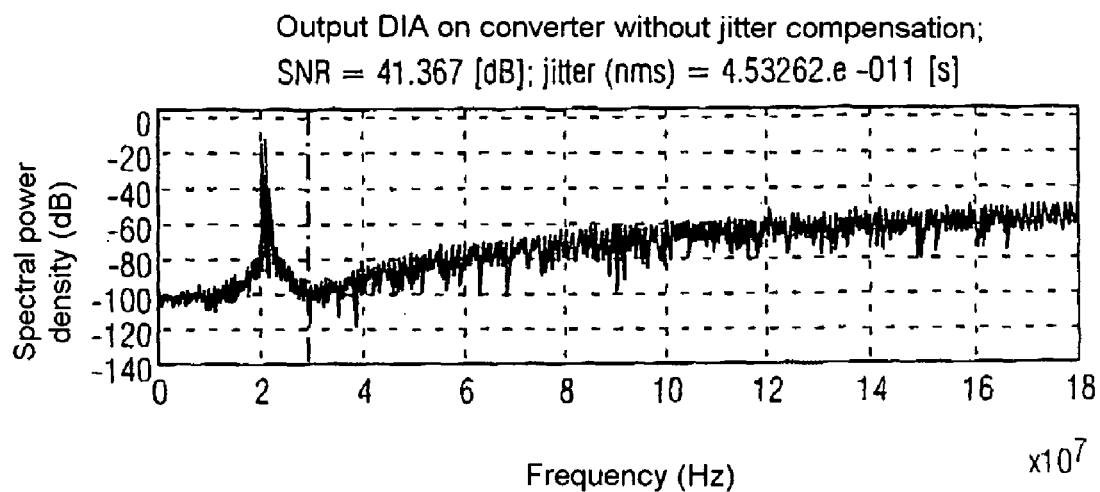
FIG. 8 are simulation results of the spectral power density at the output of the digital/analogue converter with and without jitter compensation by means of the inventive compensation circuit.
Figure 8B:
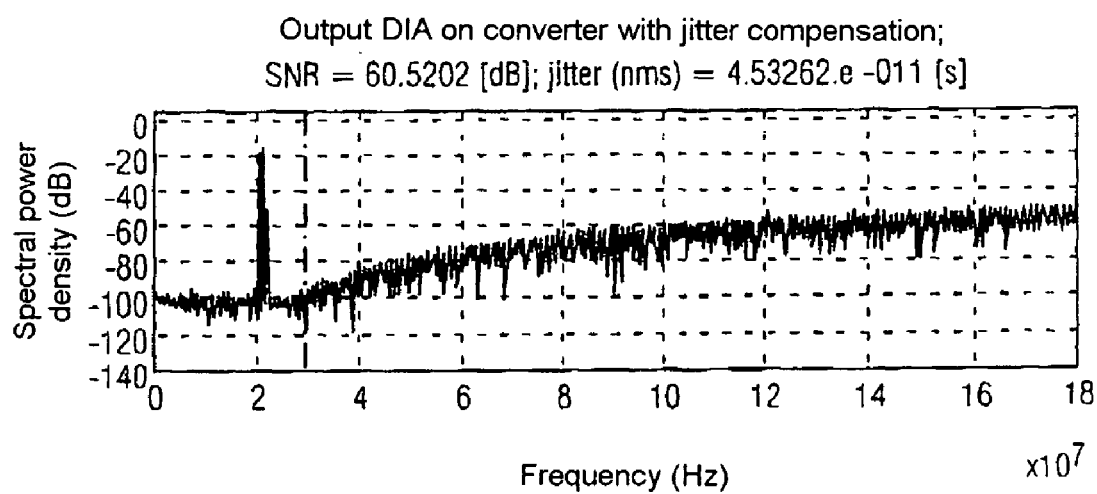

FIGS. 8a, 8b show simulation results obtained using the test arrangement illustrated in FIG. 7. FIG. 8a shows the spectral power density at the output of the digital/analogue converter 11 without jitter compensation in dB. The simulation is simulated for a VDSL application, that is to say at a sampling rate of 360 MHz and an oversampling ratio OSR of 6. FIG. 8a shows the spectral effect of a jitter error of the clock signal for a jitter of 45 ps rms on a sinusoidal input signal. In the fundamental frequency band up to $3 \cdot 10^7$ Hz on the one hand the frequency peak caused by the sinusoidal signal is evident, as well as a hump-shaped spectral rise in the power density produced by the jitter error.

FIG. 8b shows the spectral power density at the output of the digital/analogue converter 11 when jitter compensation is performed using the modelling circuit 1B. In the fundamental frequency band the frequency peak caused by the sinusoidal signal continues to be evident. The spectral disturbances produced by the jitter error as evident in FIG. 8a are not present in the fundamental frequency band. FIG. 8b shows the fundamental frequency band $3 \cdot 10^7$ Hz with a constant spectral power density of −100 dB.

Figure 9:
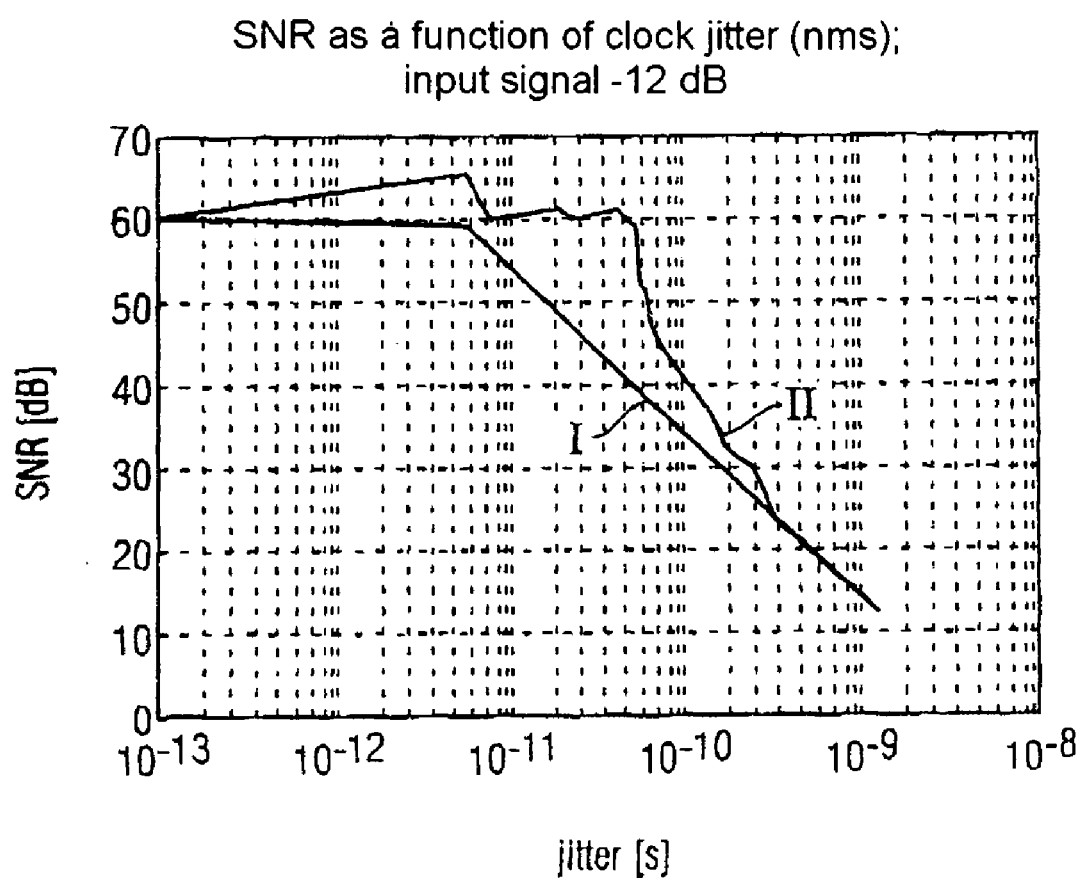
FIG. 9 is a simulation result of the signal-to-noise ratio SNR with and without jitter compensation by means of the inventive compensation circuit.

FIG. 9 shows a further simulation result in which the signal-to-noise ratio SNR is represented as a function of the clock jitter. Curve I shows the waveform of the signal-tonoise ratio SNR without the jitter compensation according to the invention. In the case of a conventional digital/analogue converter without jitter compensation, the signal-to-noise ratio SNR falls continuously from a jitter of around $10^{-11}$ seconds. Curve II shows the signal-to-noise ratio SNR of a digital to analogue conversion when the jitter compensation circuit 1 according to the invention is used in accordance with the invention. The signal-to-noise ratio SNR does not fall continuously until a far greater jitter of around $10^{-10}$ seconds. As can be seen from FIG. 9, with the compensation circuit 1 according to the invention, a jitter error greater by a factor of 10 can be tolerated for a given signal-to-noise ratio SNR. With the compensation circuit 1 according to the invention therefore, it is possible to use clock signal sources on the chip which generate a clock signal CLK with a relatively high jitter error. In terms of circuitry, said clock signal sources are less costly to implement. With the jitter compensation circuit 1 according to the invention, it is therefore possible to employ conventional ring oscillator PLL circuits or quartz circuits for generating clock signals, which have far less complex circuitry than LC-PLL circuits. For instance, jitter requirements of the clock signal with a jitter of less than 10 ps must be used for VDSL systems. To achieve this, LC-PLL circuits having an oscillator frequency $f_{OSC}$ of 3.5 GHz have been used to date. Said LC-PLL circuits each require 50 milliwatt and take up approximately 0.43 mm$^2$ of the chip surface. With the jitter compensation circuit 1 according to the invention it is possible to extend the jitter requirement for the generated signal to approximately 50 ps. As a result, it is possible to use a conventional ring oscillator PLL instead of the LC-PLL circuit. A ring oscillator PLL has a far lower power dissipation of approximately 5 milliwatt and a much smaller chip area in the order of 0.15 mm$^2$. Although modifications and changes may be suggested by those skilled in the art, it is the intention of the inventor to embody within the patent warranted hereon all changes and modifications as reasonably and properly come within the scope of his contribution to the art.

What is claimed is:

1. A compensation circuit for a digital/analogue converter, which is clocked by a clock signal comprising a jitter and converts a digital input data signal into an analogue output data signal comprising a jitter error due to said jitter; said compensation circuit comprising:
   a measurement circuit for measuring said jitter; and
   a modelling circuit for generating a digital modelled jitter error signal which simulates said jitter error dependent on said measured jitter and said digital input data signal;
   wherein said digital modelled jitter error signal is subtracted from said digital input data signal.

2. The circuit of claim 1, wherein a noise shaper for forming a quantization noise spectrum is connected upstream of said digital/analogue converter.

3. The circuit of claim 2, wherein said noise shaper comprises a feedback loop and said digital modelled jitter error signal is fed into said feedback loop.

4. The circuit of claim 2, wherein said noise shaper comprises:
   an input for receiving a digital data signal comprising a word width of n data bits;
   a separation circuit which separates said data signal into m most significant data bits and into k least significant data bits; and
   an output for outputting said m most significant data bits as said digital input data signal to said digital/analogue converter.

5. The circuit of claim 4, wherein said k least significant data bits are fed back to said input of said noise shaper via a digital feedback filter.

6. The circuit of claim 5, wherein a first subtractor is connected upstream of said digital feedback filter; said first subtractor subtracting said digital modelled jitter error signal from said least significant data bits.

7. The circuit of claim 4, wherein an amplitude limiter is connected upstream of said separation circuit of said noise shaper.

8. The circuit of claim 1, wherein an analogue/digital converter is provided between said measurement circuit and said modelling circuit; said analogue/digital converter converting said measured jitter into a digital jitter value.

9. The circuit of claim 8, wherein an averaging circuit for forming an average of said measured jitter can be connected upstream of said analogue/digital converter by means of a switch.

10. The circuit of claim 1, wherein said modelling circuit comprises:
    a delay element for generating a delayed digital input item by delaying an input data item of said digital input signal by one clock pulse period;
    a second subtractor which subtracts said delayed digital input data item from said digital input data item to generate a differential value;
    a mixer which multiplies said jitter value output by said analogue/digital converter by said differential value in order to generate a product value; and
    a weighting circuit which applies a weighting to said generated product value in order to generate a jitter error value of said modelled jitter error signal.

11. The circuit of claim 1, wherein said clock signal is generated by a PLL circuit.

12. The circuit of claim 11, wherein said PLL circuit is a ring oscillator PLL circuit.

13. The circuit of claim 10, wherein said weighting circuit comprises:
    a first multiplier for weighting said product value with the inverse clock pulse period of said clock signal and
    a second multiplier for weighting with a selectable scaling factor connected in series with said first multiplier.

14. The circuit of claim 13, wherein an amplitude limiter is connected downstream of said weighting circuit provided within said modelling circuit.

15. The circuit of claim 1, wherein said measurement circuit is formed by an analogue switched capacitor measurement circuit.

* * * * *